United States Patent [19]

Schmidt et al.

[11] Patent Number: 5,157,829
[45] Date of Patent: Oct. 27, 1992

[54] METHOD OF BURN-IN TESTING OF CIRCUITRY

[75] Inventors: Paul J. Schmidt, Waupaca; William P. D. Carter, Manawa, both of Wis.

[73] Assignee: Outboard Marine Corporation, Waukegan, Ill.

[21] Appl. No.: 591,627

[22] Filed: Oct. 2, 1990

[51] Int. Cl.⁵ .............................................. H05K 3/02
[52] U.S. Cl. .................................... 29/846; 29/830; 774/260; 361/412; 361/415
[58] Field of Search .................. 29/830, 825, 896; 361/415, 412

[56] References Cited

U.S. PATENT DOCUMENTS

| | | | |
|---|---|---|---|
| 3,939,381 | 2/1976 | Meary | 174/254 X |
| 4,179,724 | 12/1979 | Bonhomme | 361/415 X |
| 4,488,354 | 12/1984 | Chan et al. | 29/830 |
| 4,633,175 | 12/1986 | Ritchie et al. | 324/158 F |
| 4,636,726 | 1/1987 | Santomango et al. | 324/158 F |
| 4,659,986 | 4/1987 | Elster et al. | 324/158 F |
| 4,683,424 | 7/1987 | Cutright et al. | 324/158 F |
| 4,725,775 | 2/1988 | McMinn | 324/158 F |
| 4,766,371 | 8/1988 | Moriya | 324/158 F |
| 4,767,983 | 8/1988 | Pfaff | 324/158 F |
| 4,777,434 | 10/1988 | Miller et al. | 324/158 F |
| 4,779,047 | 10/1988 | Solstad et al. | 324/158 F |
| 4,799,021 | 1/1989 | Cozzi | 324/158 F |
| 4,900,948 | 2/1990 | Hamilton | 361/412 X |
| 5,003,156 | 3/1991 | Kilpatrick et al. | 324/158 F X |
| 5,021,733 | 6/1991 | Ebihara et al. | 324/158 R X |

*Primary Examiner*—Carl J. Arbes
*Attorney, Agent, or Firm*—Michael, Best & Friedrich

[57] ABSTRACT

A method of burn-in testing circuitry, the method comprising the steps of providing a single printed circuit board substrate having first and second sections, defining, after the substrate providing step, a plurality of discrete circuits on respective portions of the first section of the single printed circuit board substrate, forming, after the defining step, conductive traces and an edge connector on the second section of the printed circuit board substrate, the traces starting from the circuits and ending at the edge connector on the printed circuit board substrate, the printed circuit board substrate, the circuits, the traces, and the edge connector defining a printed circuit board, and the edge connector having conductive portions respectively connected to the circuits by the traces, providing a burn-in test unit adapted to receive the printed circuit board and to interface with the edge connector for burn-in testing of the circuits on the printed circuit board substrate, inserting, after the forming and test unit providing steps, the printed circuit board into the burn-in test unit such that the burn-in test unit interfaces with the edge connector, and causing, after the inserting step, the burn-in test unit to burn-in test the circuits.

8 Claims, 5 Drawing Sheets

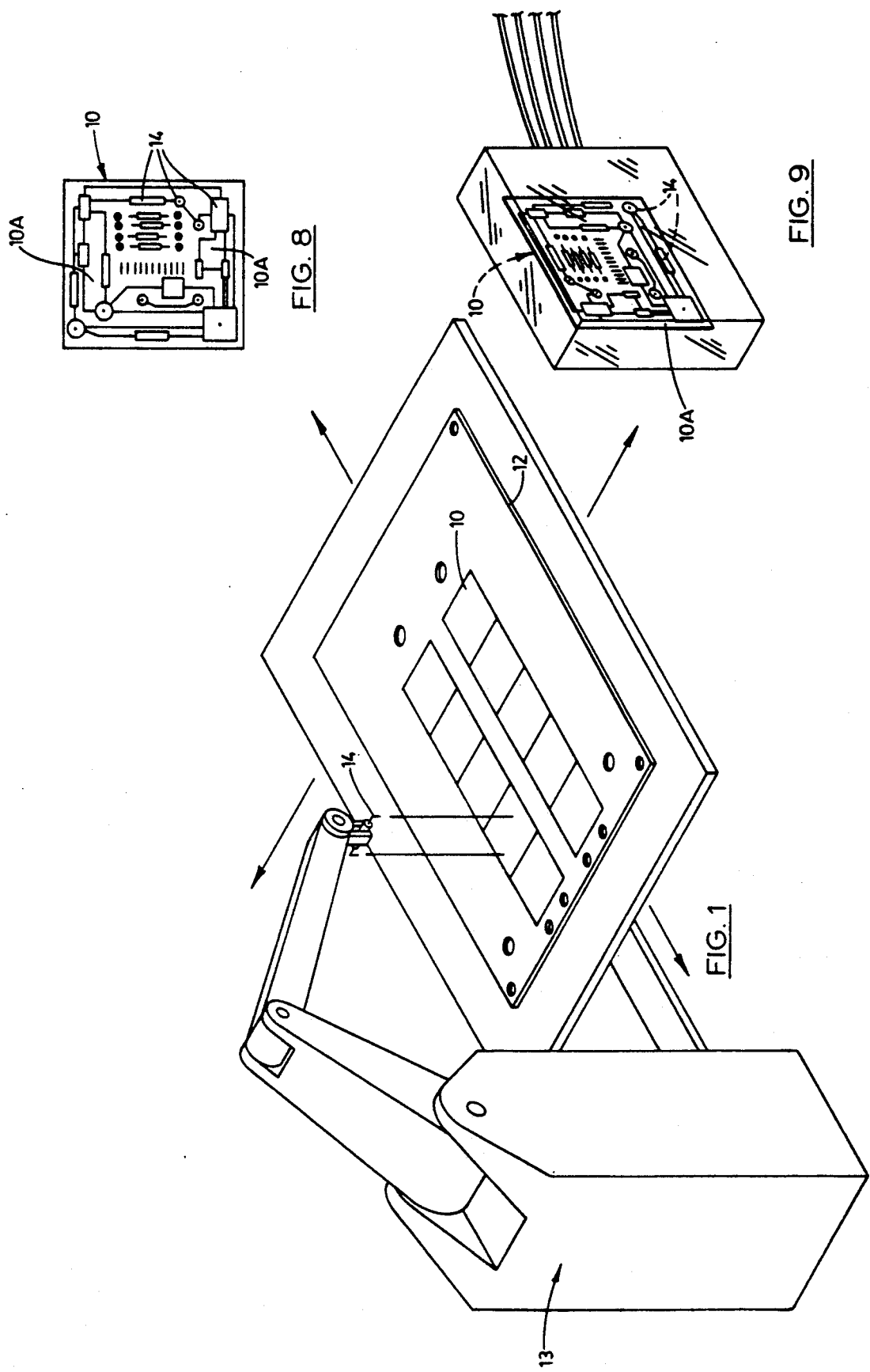

METHOD OF BURN-IN TESTING OF CIRCUITRY

BACKGROUND OF THE INVENTION

The invention relates generally to burn-in testing of electronic circuitry. More particularly, the invention relates to burn-in testing of electronic circuits defined on printed circuit board substrates.

Although the prior art provides several methods of burn-in testing integrated circuits (IC's), some methods of burn-in testing circuit assemblies defined on printed circuit board substrates requires complicated expensive tooling. For example, conductive leads connected to present burn-in test controllers are typically soldered to each separate circuit assembly, and the leads are isolated to prevent short-circuits. In other method of testing circuits, printed circuit boards are inserted into hand manipulable baskets, which baskets are then inserted into a burn-in oven, each of the printed circuit boards defining a single circuit and representing the final form of the circuit.

Attention is directed to the following U.S. patents:

| U.S. Pat. No. | Inventor(s) | Issue Date |
| --- | --- | --- |
| 4,638,424 | Cutright et al. | July 28, 1987 |
| 4,633,175 | Ritchie et al. | December 30, 1986 |
| 4,659,986 | Elster et al. | April 21, 1987 |
| 4,725,775 | McMinn | February 16, 1988 |
| 4,766,371 | Moriya | August 23, 1988 |
| 4,767,983 | Pfaff | August 30, 1988 |
| 4,777,434 | Miller et al. | October 11, 1988 |
| 4,779,047 | Solstad et al. | October 18, 1988 |
| 4,799,021 | Cozzi | January 17, 1989. |

SUMMARY OF THE INVENTION

A method of burn-in testing circuitry, the method comprising the steps of providing a single printed circuit board substrate having first and second sections, defining, after the substrate providing step, a plurality of discrete circuits on respective portions of the first section of the single printed circuit board substrate, forming, after the defining step, conductive traces and an edge connector on the second section of the printed circuit board substrate, the traces starting from the circuits and ending at the edge connector on the printed circuit board substrate, the printed circuit board substrate, the circuits, the traces, and the edge connector defining a printed circuit board, and the edge connector having conductive portions respectively connected to the circuits by the traces, providing a burn-in test unit adapted to receive the printed circuit board and to interface with the edge connector for burn-in testing of the circuits on the printed circuit board substrate, inserting, after the forming and test unit providing steps, the printed circuit board into the burn-in test unit such that the burn-in test unit interfaces with the edge connector, and causing, after the inserting step, the burn-in test unit to burn-in test the circuits.

One aspect of the invention provides the product formed by a method of burn-in testing circuitry, the method comprising the steps of providing a single printed circuit board substrate, defining a plurality of discrete circuits on respective portions of the single printed circuit board substrate, forming, after the defining step, conductive traces and an edge connector on the printed circuit board substrate, the traces starting from the circuits and ending at the edge connector on the printed circuit board substrate, the printed circuit board substrate, the circuits, the traces, and the edge connector defining a printed circuit board, and the edge connector having conductive portions respectively connected to the circuits by the traces, providing a burn-in test unit adapted to receive the printed circuit board and to interface with the edge connector for burn-in testing of the circuits on the printed circuit board substrate, inserting, after the forming and test unit providing steps, the printed circuit board into the burn-in test unit such that the burn-in test unit interfaces with the edge connector, causing, after the inserting step, the burn-in test unit to burn-in test the circuits, and separating one of the portions of the substrate having defined thereon one of the circuits from the remainder of the substrate after the step of causing the burn-in test unit to burn-in test the circuits.

Another aspect of the invention provides a burn-in test unit for burn-in testing a printed circuit board, the printed circuit board including a plurality of circuits, an edge connector, and circuit traces connecting the circuits to the edge connector, the burn-in test unit comprising a burn-in oven, a circuit-board rack adapted to receive a circuit board and mounted in the burn-in oven, means for interfacing with the edge connector of the printed circuit board when the printed circuit board is inserted into the circuit-board rack in the burn-in oven, and controller means, connected to the interfacing means, for separately supplying a voltage bias to each circuit on the printed circuit board.

Other features and advantages of the invention will become apparent to those skilled in the art upon review of the following detailed description, claims and drawings.

BRIEF DESCRIPTION OF THE VIEWS OF THE DRAWINGS

FIG. 1 is a perspective view illustrating circuit components being mounted to a printed circuit board substrate to partially define a circuit, in accordance with the method of the invention.

FIG. 8 shows one of the circuits of FIG. 2 after the circuits are isolated as shown in FIG. 7.

FIG. 9 is a perspective view of the circuit of FIG. 8 after being packaged in accordance with the method of the invention.

Figure 3:
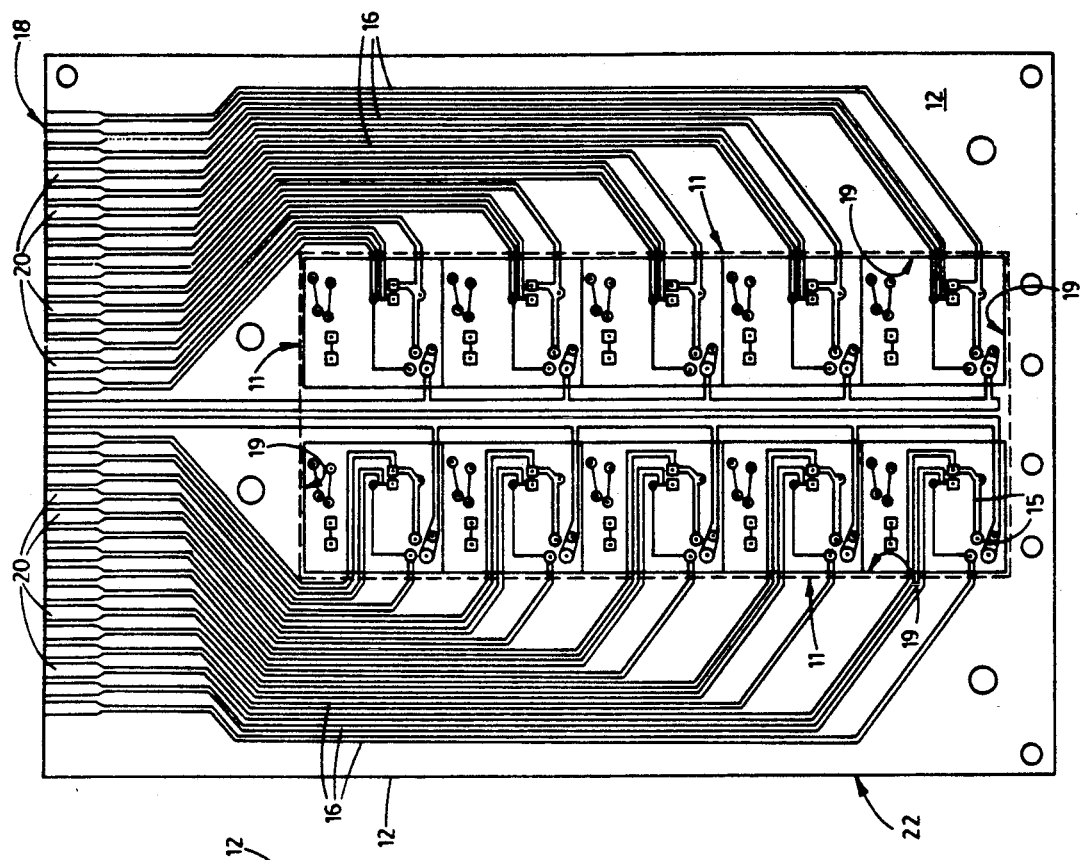
FIG. 3 is the substrate and circuits of FIG. 2 after one of the steps of the method of the invention.

Before one embodiment of the invention is explained in detail, it is to be understood that the invention is not limited in its application to the details of construction and the arrangements of components set forth in the following description or illustrated in the drawings. The invention is capable of other embodiments and of being practiced or being carried out in various ways. Also, it is to be understood that the phraseology and terminology used herein is for the purpose of description and should not be regarded as limiting.

DETAILED DESCRIPTION OF THE PREFERRED EMBODIMENT OF THE INVENTION

Illustrated in the various figures is a method of burn-in testing circuitry. The method comprises (see FIGS. 1 and 2) the step of defining a plurality of discrete circuits 10 on respective portions 10A of a first section 11 (which first section is defined inside the dotted lines shown in FIG. 2) of a single printed circuit board substrate 12. The circuits 10 are discrete in that each circuit 10 is not intended to be used as a sub-circuit within a bigger circuit on the same substrate 12, in that each circuit 10 is capable of functioning independently of the other circuits 10, and in that each circuit 10 is intended to be packaged, along with the portion of the substrate 12 on which the circuit 10 is defined, separate from any other circuit 10 or from any other circuit that is defined on the same or another printed circuit board substrate. Preferably, the circuits 10 are identical. Preferably the circuits 10 are partially defined by (see FIG. 1) components 14 that are mounted to the printed circuit board substrate 12 using surface mount technology, for example with an insertion machine 13, although it is envisioned that a conventional manual "through-hole" method could be used to mount the components 14 to the printed circuit board substrate 12 (see FIGS. 1 and 2). Preferably, at least one of the components 14 is discrete (i.e. not an IC). The circuits 10 are also partially defined by (see FIGS. 2 and 3) metal 15 that remains on the printed circuit board substrate 12 after a conventional etching operation, as is well known in the art.

Figure 2:
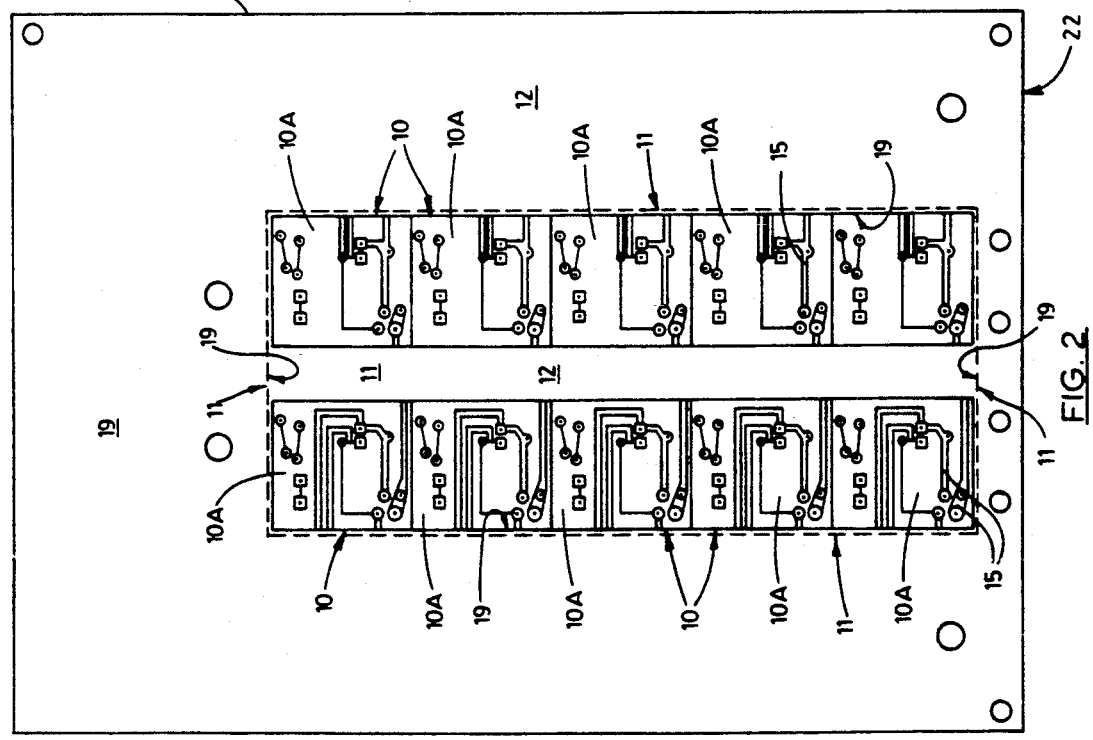
FIG. 2 is a front plan view of the printed circuit board substrate of FIG. 1 having a plurality of circuits defined thereon, which substrate and circuits are used in conjunction with the method of the invention.

The method further comprises (see FIG. 3) the step of forming, after the above defining step, conductive traces 16 and an edge connector 18 on a second section 19 (which second section is defined outside the dotted lines shown in FIG. 2) of the printed circuit board substrate 12, the traces 16 starting from the circuits 10 and ending at the edge connector 18. The edge connector 18 has conductive portions 20 respectively connected to the circuits 10 by the traces 16. The conductive traces 16 and the edge connector 18 can be formed on the printed circuit board substrate by metal that remains after the above-mentioned etching operation, or can be added to the circuit board substrate 12 after the circuits 10 are defined on the substrate 12. When the required size of the printed circuit board substrate 12 is determined, prior to the circuits 10 being defined on the substrate 12, extra substrate material must be allocated to accommodate the traces 16. Although there may be more than one possible definition of the phrase "printed circuit board", herein the printed circuit board substrate 12, the circuits 10, the traces 16, and the edge connector 18 define a printed circuit board 22.

Figure 5:
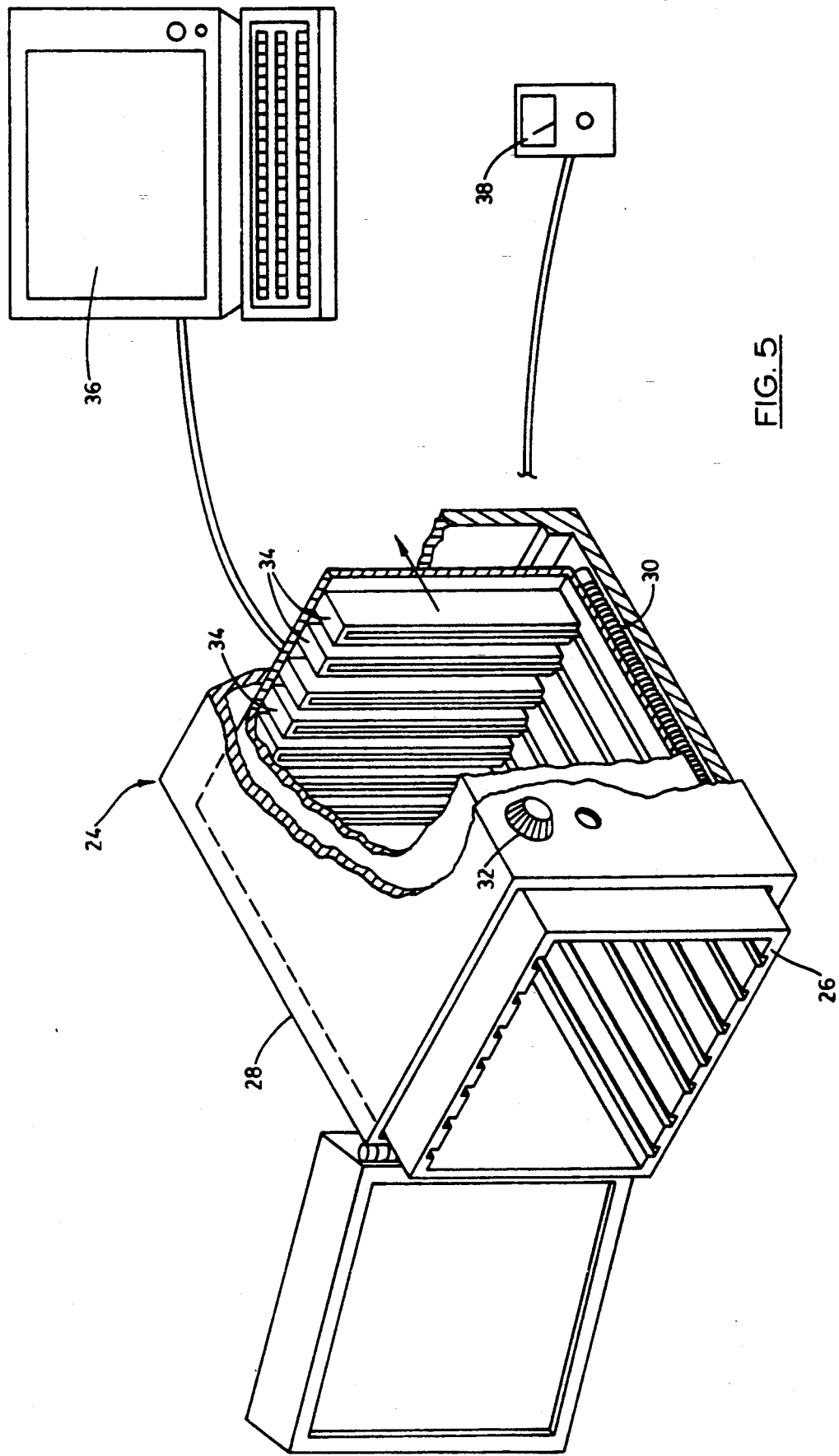
FIGS. 5 and 6 are partially perspective views showing a burn-in test unit embodying various of the features of the apparatus of the invention, which apparatus is used in conjunction with the method of the invention.
Figure 6:
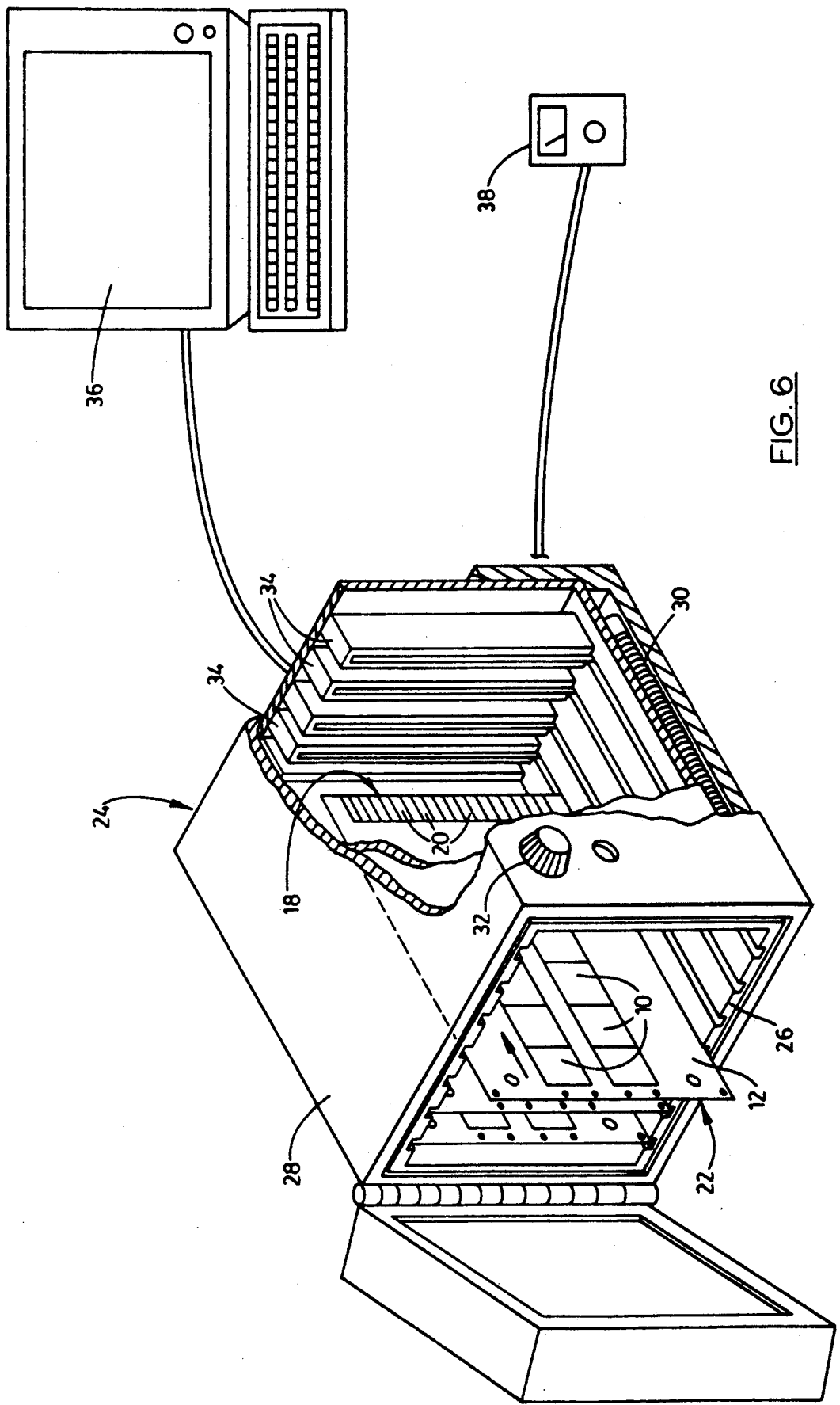

The method further comprises the step of (see FIGS. 5 and 6) providing a burn-in test unit 24 that is adapted to receive the printed circuit board 22 and to interface with the edge connector 18 of the printed circuit board 22 for burn-in testing of the circuits 10 on the printed circuit board substrate 12. More particularly, the step of providing a burn-in test unit comprises the step of installing a circuit board rack 26, of the type adapted to receive at least one, and preferably a plurality of circuit boards 22, in a burn-in test oven 28 to define the burn-in test unit 24. Still more particularly, the burn-in test unit 24 provides for burn-in testing of at least one, and preferably a plurality of printed circuit boards 22, each of the printed circuit boards 22 including a plurality of circuits 10, an edge connector 18, and circuit traces 16 connecting the circuit 10 to the edge connector 18, and comprises the burn-in oven 28. The burn-in test oven 28 includes a heat source 30, and a heat controller 32 for adjustably controlling the amount of heat generated by the heat source 30. The unit 24 also comprises the circuit-board rack 26 mounted in the burn-in oven 28, and means for interfacing with the edge connector 18 of the circuit board 22 when the circuit board 22 is inserted into the circuit-board rack 26 in the burn-in oven. In the illustrated embodiment, the means for interfacing with the edge connector is a socket 34 of the type associated with edge connectors of printed circuit boards. The unit 24 also comprises controller means, connected to the interfacing means, for separately supplying a voltage bias to each of the circuits 10 on each printed circuit board 22. Preferably, but optionally, the controller means further supplies separate signals to each of the circuits 10 on each printed circuit board 22. As is known in the art, a much more strenuous burn-in test is obtained when a signal is provided to a circuit being tested (when the circuit is actually caused to operate to perform the input and output functions that it is designed to perform) than when only a voltage bias is provided to the circuit (when a voltage source is connected to the circuit, but the circuit is not required to operate). While various other means could be employed, in the illustrated embodiment, the controller means comprises a computer 36 and, if necessary, an external voltage bias source 38.

The method further comprises (see FIG. 6) the step of inserting, after the step of forming the conductive traces 16 and the edge connector 18 and the step of providing the burn-in test unit 24, the printed circuit board 22 into the burn-in test unit 24 such that the burn-in test unit 24 interfaces with the edge connector 18. Preferably, more than one printed circuit board 22 is inserted into the burn-in test unit 24, such that the burn-in test unit 24 interfaces with the edge connector 18 of each printed circuit board 22, after the step of forming the conductive traces 16 and the edge connector 18 and the step of providing the burn-in test unit 24.

The method further comprises (see FIG. 6) the step of causing the burn-in test unit 24 to burn-in test the circuits 10 after the step of inserting the printed circuit board 22 into the burn-in test unit 24. This is done, in the illustrated embodiment, by operating the heat controller 32 so that the heat source 30 heats the burn-in test unit 24, and by operating the computer 36 so that at least a voltage bias (preferably a voltage bias and a signal) is applied to the circuits 10.

The method further comprises (see FIG. 7) the step of separating the section 19 of the printed circuit board substrate 12 having only the traces 16 thereon from the section 11 of the printed circuit board substrate 12 on which the discrete circuits 10 are defined, and thereby severing the traces 16 from the circuits 10, after the step of causing the burn-in test unit 24 to burn-in test the circuits 10.

The method further comprises (see FIGS. 7 and 8) the step of separating one of the portions 10A having defined thereon one of the circuits 10 from the remainder of the portions 10A, after the step of causing the burn-in test unit 24 to burn-in test the circuits 10. This step of separating the one of the portions 10A from the remainder of the portions 10A preferably includes the step of separating the one portion 10A from any portion of the section 11 that has conductive traces 16 formed thereon. (In the illustrated embodiment, some traces 16 are formed on the section 11, between rows of the circuits 10, in addition to the traces 16 formed on the section 19. See FIG. 3.) The step of separating the one of the portions 10A from the remainder of the portions 10A can be performed after or, preferably, contemporaneously with the step of separating the section 19 from the section 11.

Figure 7:
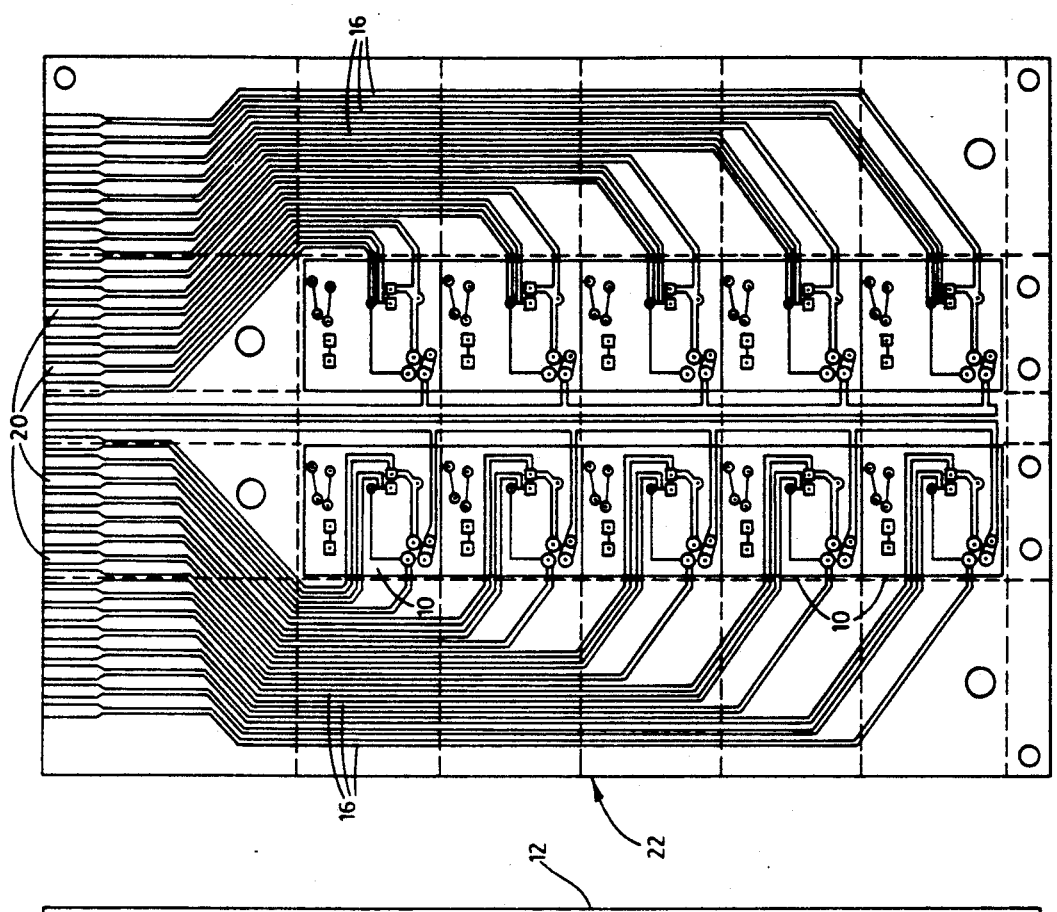
FIG. 7 illustrates the circuits of FIG. 2 being isolated in accordance with the method of the invention.
Figure 4:
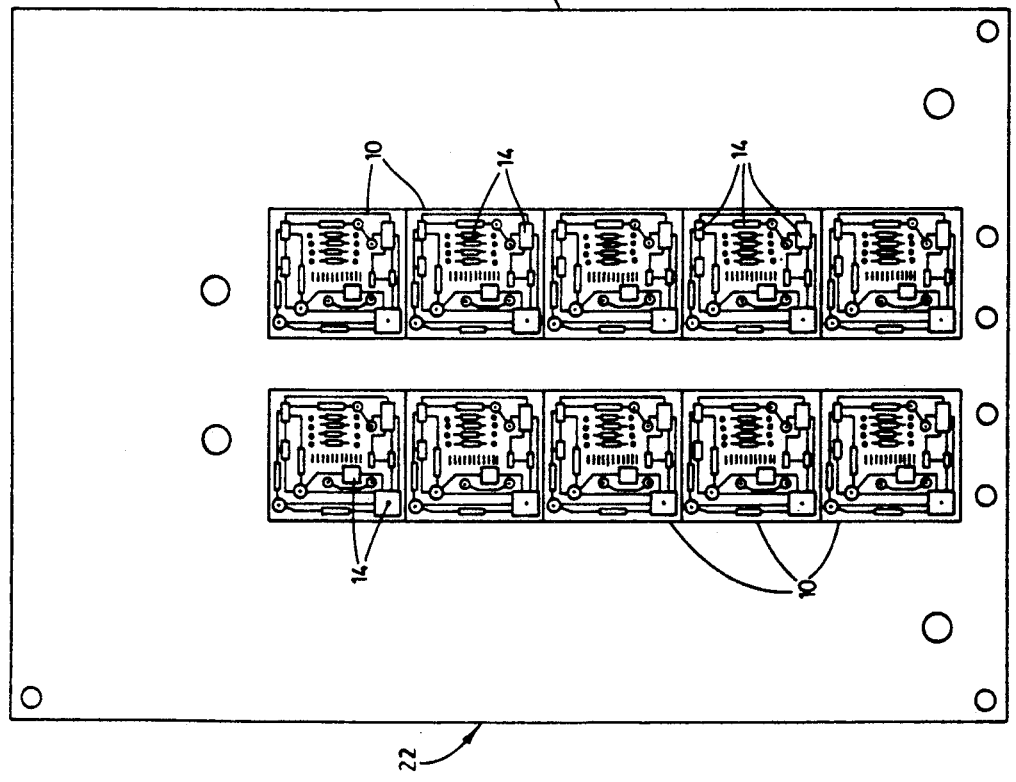
FIG. 4 is a rear plan view of the substrate and circuits of FIG. 2.

Both of the separating steps are preferably performed using straight cut lines (illustrated with dotted lines in FIG. 7), assuming that the circuits 10 are each defined on rectangular portions of the substrate 12 (see FIGS. 7 and 8).

Each of the circuits 10 is packaged, in plastic for example, after both separating steps (see FIG. 9).

Various of the features of the invention are set forth in the following claims.

We claim:

1. A method of burn-in testing circuitry, said method comprising the steps of:

providing a printed circuit board substrate having first and second sections, defining, after said substrate providing step, a plurality of discrete circuits on respective portions of the first section of the printed circuit board substrate, the discrete circuits each including conductive traces on the substrate and each circuit including a plurality of separate circuit components, each of which components is attached to the substrate, at least one of which components is permanently attached to the substrate and is not a semiconductor socket, and each of which components is electrically connected to another circuit component in the discrete circuit by the conductive traces on the first section of the substrate, forming, after said defining step, conductive traces and an edge connector on the second section of the printed circuit board substrate, the traces on the second section of the substrate starting from the circuits and ending at the edge connector on the printed circuit board substrate, the printed circuit board substrate, the circuits, the traces on the first and second sections of the substrate, and the edge connector defining a printed circuit board, and the edge connector having conductive portions respectively connected to the circuits by the traces on the second section of the substrate, providing a burn-in test unit adapted to receive the printed circuit board and to interface with the edge connector for burn-in testing of the circuits on the printed circuit board substrate, inserting, after said forming and test unit providing steps, the printed circuit board into the burn-in test unit such that the burn-in test unit interfaces with the edge connector, and causing, after said inserting step, the burn-in test unit to burn-in test the circuits.

2. A method in accordance with claim 1 wherein said step of defining a plurality of discrete circuits comprises the step of defining a plurality of identical discrete circuits.

3. A method in accordance with claim 1 wherein said step of forming conductive traces and an edge connector comprises the step of adding metal to the printed circuit board substrate, to define the conductive traces and the edge connector, after said step of defining a plurality of discrete circuits on a single printed circuit board substrate.

4. A method in accordance with claim 1 wherein the components of the circuit are mounted to the printed circuit board substrate using surface mount technology before said step of causing the burn-in test unit to burn-in test the circuits.

5. A method of burn-in testing circuitry, said method comprising the steps of:

providing a printed circuit board substrate having first and second sections, defining, after said substrate providing step, a plurality of discrete circuits on respective portions of the first section of the printed circuit board substrate, the discrete circuits each including conductive traces on the substrate and including a plurality of separate circuit components each of which is attached to the substrate and each of which is electrically connected to another circuit component in the discrete circuit by the conductive traces on the first section of the substrate, forming, after said defining step, conductive traces and an edge connector on the second section of the printed circuit board substrate, the traces on the second section of the substrate starting from the circuits and ending at the edge connector on the printed circuit board substrate, the printed circuit board substrate, the circuits, the traces on the first and second sections of the substrate, and the edge connector defining a printed circuit board, and the edge connector having conductive portions respectively connected to the circuits by the traces on the second section of the substrate.

providing a burn-in test unit adapted to receive the printed circuit board and to interface with the edge connector for burn-in testing of the circuits on the printed circuit board substrate, inserting, after said forming and test unit providing steps, the printed circuit board into the burn-in test unit such that the burn-in test unit interfaces with the edge connector, causing, after said inserting step, the burn-in test unit to burn-in test the circuits, and separating the second section of the printed circuit board substrate having thereon only the traces from the first section of the printed circuit board substrate on which the discrete circuits are formed, and thereby severing the traces from the circuits, after said step of causing said burn-in test unit to burn-in test the circuits.

6. A method of burn-in testing circuitry, said method comprising the steps of:

providing a printed circuit board substrate having first and second sections, defining, after said substrate providing step, a plurality of discrete circuits on respective portions of the first section of the printed circuit board substrate, the discrete circuits each including conductive traces on the substrate and including a plurality of separate circuit components each of which is attached to the substrate and each of which is electrically connected to another circuit component in the discrete circuit by the conductive traces on the first section of the substrate, forming, after said defining step, conductive traces and an edge connector on the second section of the printed circuit board substrate, the traces on the second section of the substrate starting from the circuits and ending at the edge connector on the printed circuit board substrate, the printed circuit board substrate, the circuits, the traces on the first and second sections of the substrate, and the edge connector defining a printed circuit board, and the edge connector having conductive portions respectively connected to the circuits by the traces on the second section of the substrate, providing a burn-in test unit adapted to receive the printed circuit board and to interface with the edge connector for burn-in testing of the circuits on the printed circuit board substrate, inserting, after said forming and test unit providing steps, the printed circuit board into the burn-in test unit such that the burn-in test unit interfaces with the edge connector, causing, after said inserting step, the burn-in test unit to burn-in test the circuits, and separating one of the portions of the substrate having defined thereon one of the circuits from the remainder of the substrate, after said step of causing said burn-in test unit to burn-in test the circuits.

7. A method in accordance with claim 6 and further comprising the step of packaging the one circuit and the portion of the substrate on which the one circuit is formed, after said step of separating the portion of the substrate having defined thereon the one circuit from the remainder of the substrate.

8. A method of burn-in testing circuitry, said method comprising the steps of:

providing a single printed circuit board substrate having first and second sections, defining, after said substrate providing step, a plurality of discrete circuits on respective portions of the first section of the single printed circuit board substrate, the discrete circuits each including conductive traces on the substrate and including a plurality of separate circuit components each of which is attached to the substrate and each of which is electrically connected to another circuit component in the discrete circuit by the conductive traces on the first section of the substrate, forming, after said defining step, conductive traces and an edge connector on the second section of the printed circuit board substrate, the traces on the second section of the substrate starting from the circuits and ending at the edge connector on the printed circuit board substrate, the printed circuit board substrate, the circuits, the traces on the first and second sections of the substrate, and the edge connector defining a printed circuit board, and the edge connector having conductive portions respectively connected to the circuits by the traces on the second section of the substrate, providing a burn-in test unit adapted to receive the printed circuit board and to interface with the edge connector for burn-in testing of the circuits on the printed circuit board substrate, inserting, after said forming and test unit providing steps, the printed circuit board into the burn-in test unit such that the burn-in test unit interfaces with the edge connector, causing, after said inserting step, the burn-in test unit to burn-in test the circuits, and separating one of the portions of the substrate having defined thereon one of the circuits from the remainder of the substrate after said step of causing said burn-in test unit to burn-in test the circuits, said separating step including the step of cutting the substrate.

* * * * *